(12) United States Patent
Kudo (10) Patent No.: US 11,320,324 B2
(45) Date of Patent: May 3, 2022

(54) SENSOR DEVICE (71) Applicant: MINEBEA MITSUMI Inc., Nagano (JP)

(72) Inventor: Yasuhiro Kudo, Tokyo (JP)

(73) Assignee: MINEBEA MITSUMI Inc., Nagano (JP)

( * ) Notice: Subject to any disclaimer, the term of this patent is extended or adjusted under 35 U.S.C. 154(b) by 90 days.

(21) Appl. No.: 16/739,356

(22) Filed: Jan. 10, 2020

(65) Prior Publication Data
US 2020/0240857 A1 Jul. 30, 2020

(30) Foreign Application Priority Data

Jan. 30, 2019 (JP) .............................. JP2019-014734

(51) Int. Cl.
*H01L 29/84* (2006.01)
*G01L 1/18* (2006.01)
*H01L 29/417* (2006.01)
*H01L 27/08* (2006.01)
*G01L 5/162* (2020.01)

(52) U.S. Cl.
CPC ................ *G01L 1/18* (2013.01); *G01L 5/162* (2013.01); *H01L 27/08* (2013.01); *H01L 29/417* (2013.01); *H01L 29/84* (2013.01)

(58) Field of Classification Search
CPC ....... H01L 29/417; H01L 27/08; H01L 29/84; G01L 1/18; G01L 5/162
See application file for complete search history.

(56) References Cited

U.S. PATENT DOCUMENTS

| 4,125,820 | A | * | 11/1978 | Marshall | ............... | G01L 1/2293 257/417 |
| 6,211,772 | B1 | * | 4/2001 | Murakami | ............ | G01L 9/0054 257/419 |
| 6,823,744 | B2 | | 11/2004 | Ohsato et al. | | |
| 2018/0313866 | A1 | | 11/2018 | Yamaguchi et al. | | |

FOREIGN PATENT DOCUMENTS

| EP | 3581903 A1 * | 12/2019 | ........... B81B 7/0009 |
| JP | 4011345 | 9/2007 | |
| JP | 2018-185296 | 11/2018 | |

* cited by examiner

*Primary Examiner* — Ermias T Woldegeorgis
(74) *Attorney, Agent, or Firm* — IPUSA, PLLC (57) ABSTRACT A sensor device includes a piezoresistive element that is formed in a semiconductor substrate and has a polarity opposite to a polarity of the semiconductor substrate, diffusion wirings that are formed in the semiconductor substrate and have a polarity opposite to the polarity of the semiconductor substrate, a first barrier layer formed between the adjacent diffusion wirings in the semiconductor substrate and has a same polarity as the polarity of the semiconductor substrate, and a second barrier layer that is formed on surface layers of the piezoresistive element and the diffusion wirings and have a same polarity as the polarity of the first barrier layer.

8 Claims, 11 Drawing Sheets

SENSOR DEVICE

CROSS-REFERENCE TO RELATED APPLICATIONS

This application is based on and claims priority to Japanese Patent Application No. 2019-014734, filed on Jan. 30, 2019, the entire contents of which are incorporated herein by reference.

BACKGROUND OF THE INVENTION

1. Field of the Invention

The present invention relates to a sensor device, and in particular, to a force sensor that detects force in multi-axis directions.

2. Description of the Related Art

For example, a force sensor has been known which detects force in multi-axis directions by attaching a sensor element to an initiating strain element made of metal and detecting an elastic deformation of the initiating strain element caused by applying external force.

For the above force sensor, a sensor chip manufactured using a semiconductor substrate such as an SOI (Silicon On Insulator) is used as a sensor element (see, for example, Patent Documents 1 and 2).

A piezoresistor or a diffusion wiring layer as a strain detecting element is formed in the semiconductor substrate constituting the sensor chip, and a metal wiring layer is formed on the semiconductor substrate.

[Patent Document 1]
  Japanese Patent No. 4011345
[Patent Document 2]
  Japanese Laid-open Patent Application No. 2018-185296

In recent years, because of miniaturization of sensor chips, gaps between piezoresistors, diffusion wiring, metal wiring, etc. tend to be narrowed, and there is an increasing possibility that a parasitic MOS (Metal-Oxide-Semiconductor) structure may unintentionally occur between wirings.

The occurrence of parasitic MOS structures can lead to leakage currents between adjacent diffusion wiring, between diffusion wiring and metal wiring, etc. If the leakage current occurs, the output characteristics of the sensor element are degraded.

The disclosed technique has been developed in view of the above points and is intended to suppress the generation of leakage current.

SUMMARY OF THE INVENTION

A sensor device includes a piezoresistive element that is formed in a semiconductor substrate and has a polarity opposite to a polarity of the semiconductor substrate, diffusion wirings that are formed in the semiconductor substrate and have a polarity opposite to the polarity of the semiconductor substrate, a first barrier layer formed between the adjacent diffusion wirings in the semiconductor substrate and has a same polarity as the polarity of the semiconductor substrate, and a second barrier layer that is formed on surface layers of the piezoresistive element and the diffusion wirings and have a same polarity as the polarity of the first barrier layer.

DETAILED DESCRIPTION OF EMBODIMENTS

Hereinafter, an embodiment for carrying out the invention will be described with reference to figures. In each figure, the same components are indicated by the same reference numerals and repeated descriptions may be omitted.

First Embodiment (Schematic Structure)

FIGS. 1A to 2B schematically illustrate the sensor chip 110 as a sensor element used in the force sensor according to the first embodiment.

Figure 1A:
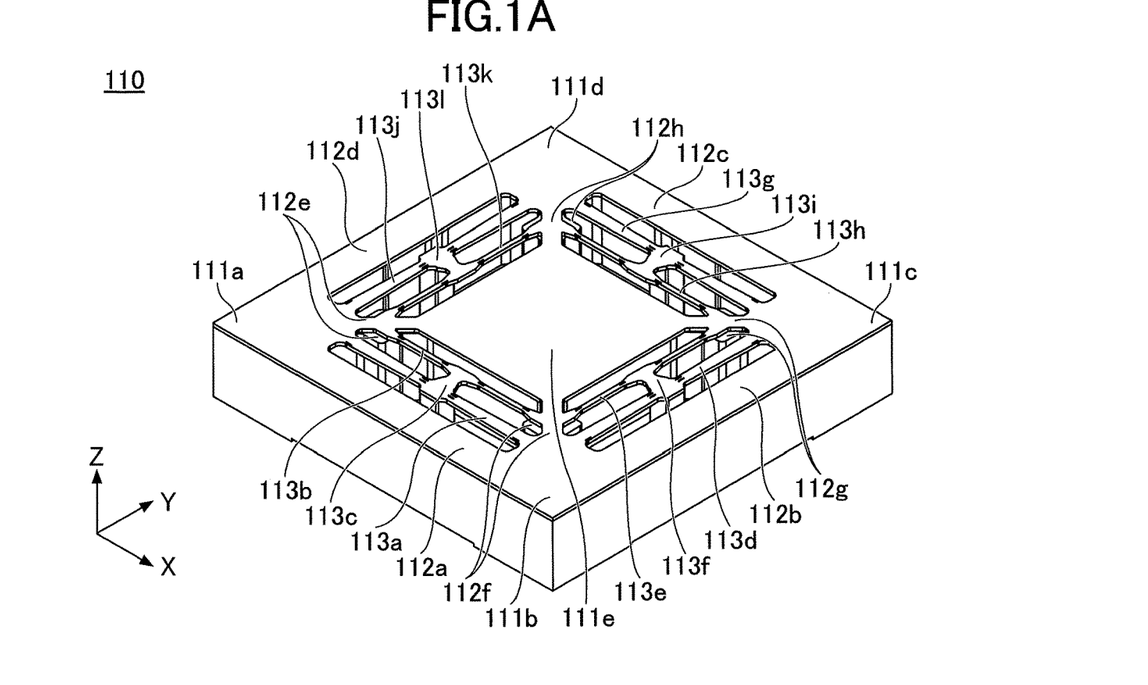
FIGS. 1A and 1B are views illustrating a sensor chip according to a first embodiment viewed from an upper side in the Z-axis direction.
Figure 1B:
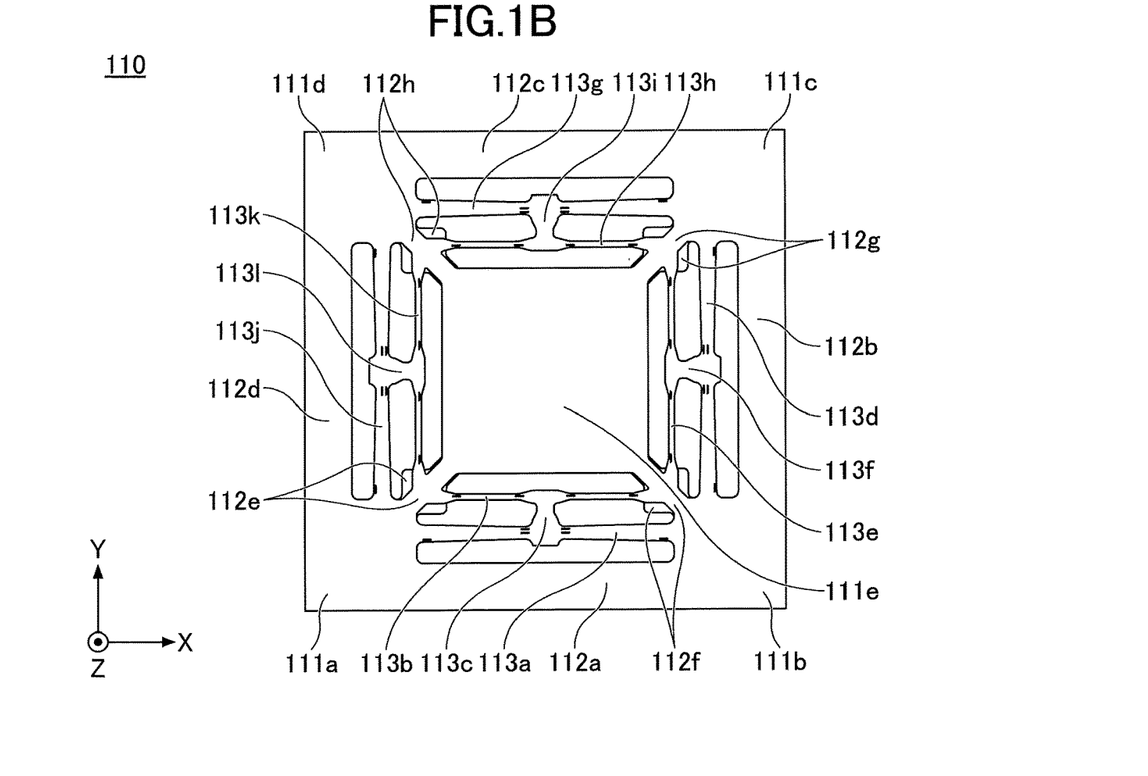
Figure 2A:
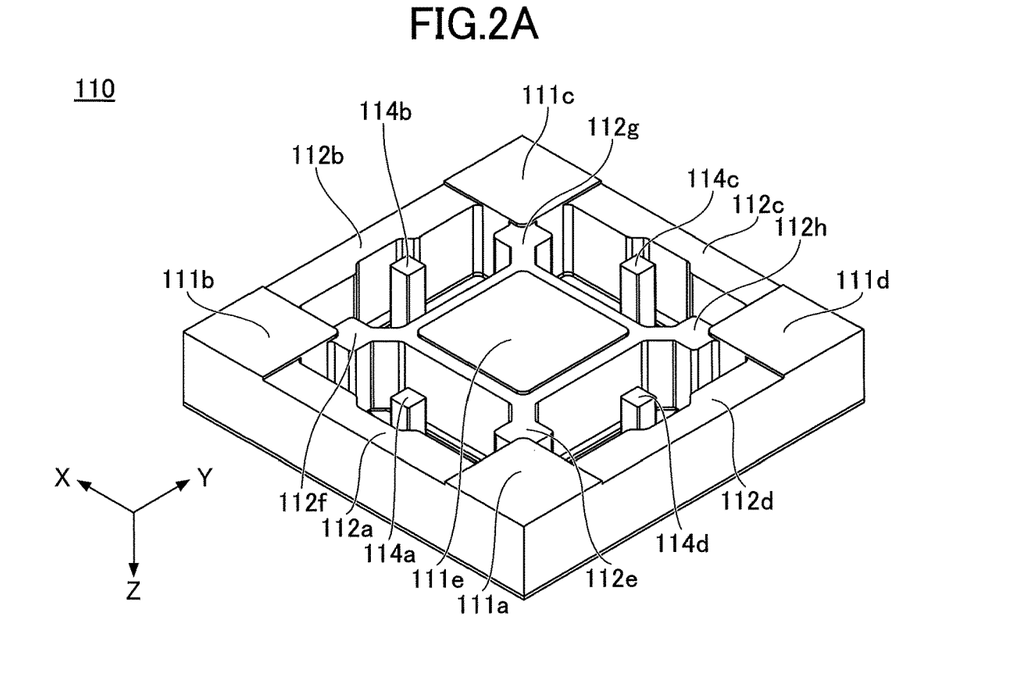
FIGS. 2A and 2B are views illustrating the sensor chip according to the first embodiment viewed from a lower side in the Z-axis direction.
Figure 2B:
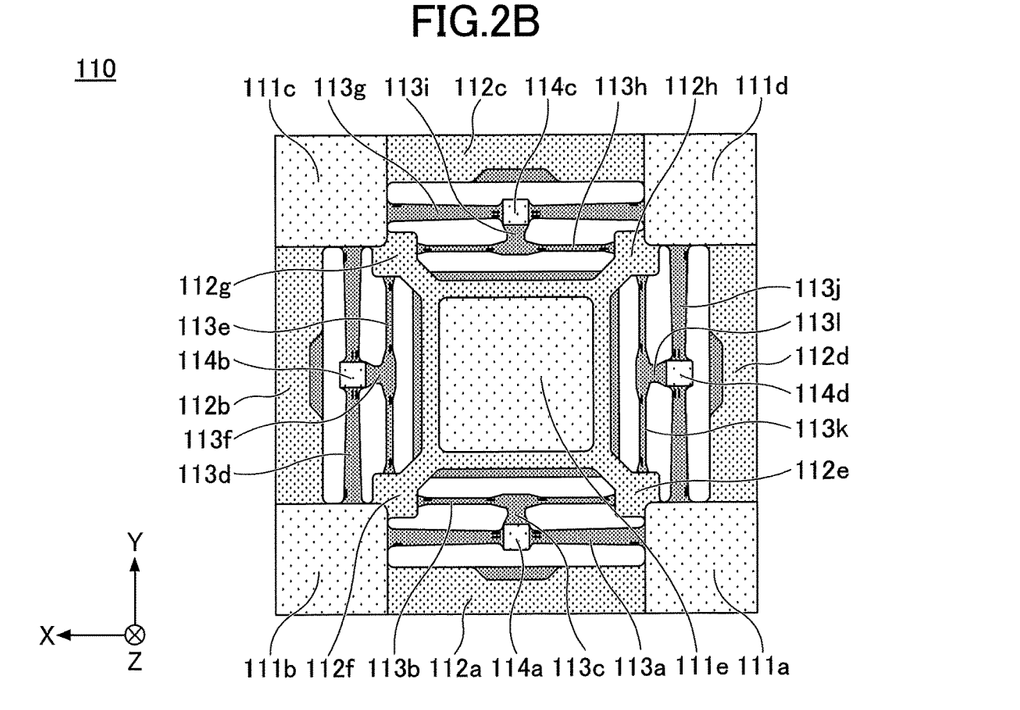

FIGS. 1A and 1B illustrate the sensor chip 110 viewed from the upper side in the Z-axis direction. FIG. 1A is a perspective view, and FIG. 1B is a plan view. FIGS. 2A and 2B illustrate the sensor chip 110 viewed from the lower side in the Z-axis direction. FIG. 2A is a perspective view, and FIG. 2B is a bottom view. The direction parallel to one side of the upper surface of the sensor chip 110 is in the X-axis direction, the vertical direction is in the Y-axis direction, and the thickness direction (the normal direction of the upper surface of the sensor chip 110) of the sensor chip 110 is in the Z-axis direction. The X-axis direction, the Y-axis direction, and the Z-axis direction are orthogonal to each other.

The sensor chip 110 is a MEMS (Micro Electro Mechanical Systems) sensor chip capable of detecting up to six axial force and/or force moments in one chip and is formed from a semiconductor substrate such as an SOI substrate. The planar shape of the sensor chip 110 may be, for example, a square of about 3000 μm square.

The sensor chip 110 includes five columnar supporting portions 111a to 111e. The planar shapes of the supporting portions 111a to 111e may be, for example, a square having sides of about 500 μm. The first supporting portions 111a to 111d are disposed at four corners of the sensor chip 110. The supporting portion 111e, which is the second supporting portion, is disposed at the center of the supporting portions 111a to 111d.

The supporting portions 111a to 111e may be formed, for example, from an active layer of an SOI substrate, a BOX layer, and a supporting portion layer, each thickness being, for example, about 500 μm.

Between the supporting portion 111a and the supporting portion 111b, a reinforcing beam 112a is provided to reinforce the structure of the supporting portion 111a and the supporting portion 111b fixed at both ends (connecting adjacent supporting portions).

Between the supporting portion 111b and the supporting portion 111c, a reinforcing beam 112b is provided for reinforcing the structure of the supporting portion 111b and the supporting portion 111c (connecting adjacent supporting portions).

Between the supporting portion 111c and the supporting portion 111d, a reinforcing beam 112c is provided for reinforcing the structure (connecting adjacent supporting portions) fixed at both ends to the supporting portion 111c and the supporting portion 111d. Between the supporting portion 111d and the supporting portion 111a, a reinforcing beam 112d is provided for reinforcing the structure of the supporting portion 111d and the supporting portion 111a (connecting adjacent supporting portions).

In other words, the four reinforcing beams 112a, 112b, 112c, and 112d, which are the first reinforcing beams, are formed as frames, and the corners forming the intersections of the respective reinforcing beams are formed as supporting portions 111b, 111c, 111d, and 111a.

The inner corners of the supporting portion 111a and the opposite corners of the supporting portion 111e are connected by a reinforcing beam 112e for reinforcing the structure. The inner corners of the supporting portion 111b and the opposite corners of the supporting portion 111e are connected by reinforcing beams 112f for reinforcing the structure.

The inner corners of the supporting portion 111c and the opposite corners of the supporting portion 111e are connected by reinforcing beams 112g for reinforcing the structure. An inner corner of the supporting portion 111d and an opposite corner of the supporting portion 111e are connected by a reinforcing beam 112h for reinforcing the structure. The second reinforcing beam 112e to 112h is disposed diagonally with respect to the X-axis direction (the Y-axis direction).

That is, the reinforcing beams 112e-112h are arranged apart from the reinforcing beams 112a, 112b, 112c, and 112d.

Reinforcing beams 112a-112h can be formed, for example, from an active layer of an SOI substrate, a BOX layer, and a supporting portion layer. The thickness (width in the shorter direction) of the reinforcing beams 112a to 112h may be, for example, about 140 μm. The top surface of each of the reinforcing beams 112a-112h is roughly the same as the top surface of the supporting portions 111a to 111e.

In contrast, the bottom surface of each of the reinforcing beams 112a-112h is depressed to the top surface of several tens of micrometers from the bottom surface of the supporting portions 111a to 111e and the bottom surface of the force points 114a to 114d.

Inside the reinforcing beam 112a between the supporting portion 111a and the supporting portion 111b, a sensing beam 113a is provided for detecting distortion, both ends of which are fixed to the supporting portion 111a and the supporting portion 111b at predetermined intervals in parallel with the reinforcing beam 112a (connecting adjacent supporting portions).

Between the sensing beam 113a and the supporting portion 111e, the sensing beam 113b is provided parallel to the sensing beam 113a while interposing a predetermined gap with the sensing beam 111a. The sensing beam 113b is connected with an end of the reinforcing beam 112e at the supporting portion 111e and an end of the reinforcing beam 112f at the supporting portion 111e.

The generally central longitudinal portion of the sensing beam 113a and the longitudinally central portion of the opposing sensing beam 113b are coupled by a sensing beam 113c positioned perpendicular to the sensing beam 113a and the sensing beam 113b.

Inside the reinforcing beam 112b between the supporting portion 111b and the supporting portion 111c, a sensing beam 113d is provided for detecting distortion (connecting adjacent supporting portions) at both ends of the supporting portion 111b and the supporting portion 111c in parallel with the reinforcing beam 112b at predetermined intervals.

Between the sensing beam 113d and the supporting portion portion 111e, a sensing beam 113e is provided parallel to the sensing beam 113d while interposing a predetermined gap with the sensing beam 113d. The sensing beam 113e is connected with an end of the reinforcing beam 112f at the supporting portion 111e side and an end of the reinforcing beam 112g at the supporting portion 111e side.

A longitudinal central portion of the sensing beam 113d and a longitudinal central portion of the opposing sensing beam 113e are coupled by a sensing beam 113f disposed perpendicular to the sensing beam 113d and the sensing beam 113e.

Inside the reinforcing beam 112c between the supporting portion 111c and the supporting portion 111d, a sensing beam 113g is provided for detecting distortion, wherein both ends of the supporting portion 111c and the supporting portion 111d are fixed in parallel with the reinforcing beam 112c at predetermined intervals (adjacent supporting portions are connected to each other).

Between the sensing beam 113g and the supporting portion portion 111e, the sensing beam 113h is provided parallel to the sensing beam 113g while interposing a predetermined gap with the sensing beam 113g. The sensing beam 113h is connected with an end of the reinforcing beam 112g at the supporting portion portion 111e side and an end of the reinforcing beam 112h at the supporting portion portion 111e side.

A longitudinally central portion of the sensing beam 113g and a longitudinally central portion of the sensing beam 113h opposite thereto are coupled by a sensing beam 113i disposed perpendicular to the sensing beam 113g and the sensing beam 113h.

Inside the reinforcing beam 112d between the supporting portion 111d and the supporting portion 111a is provided with a sensing beam 113j for detecting distortion, both ends of the supporting portion 111d and the supporting portion 111a are fixed in parallel with the reinforcing beam 112d while interposing the predetermined gaps (adjacent supporting portions are connected to each other).

Between the sensing beam 113j and the supporting portion 111e, the sensing beam 113k is provided parallel to the sensing beam 113j while interposing a predetermined gap with the sensing beam 111e. The sensing beam 113k connects an end of the reinforcing beam 112h at the supporting portion 111e and an end of the reinforcing beam 112e at the supporting portion 111e.

A substantially central portion of the sensing beam 113j in its longitudinal direction and a substantially central portion of the sensing beam 113k in its longitudinal direction are arranged so as to be arranged opposite each other and are coupled by a sensing beam 113*l* disposed perpendicular to the sensing beam 113*j* and the sensing beam 113*k*.

The sensing beams 113*a* to 113*l* are provided on the upper end side of the supporting portion 111*a* to 111*e* in the thickness direction and can be formed, for example, from the active layer of the SOI substrate. The thickness (width in the short direction) of the sensing beams 113*a* to 113*l* may be, for example, about 75 μm. The top surface of each of the sensing beams 113*a* to 113*l* is approximately the same as the top surface of the supporting portions 111*a* to 111*e*. The respective thickness of the sensing beams 113*a* to 113*l* may be, for example, about 50 μm.

A force point 114*a* is provided on the lower surface (an intersection point between the sensing beam 113*a* and the sensing beam 113*c*) of the central portion of the sensing beam 113*a* in the longitudinal direction. The sensing beams 113*a*, 113*b*, and 113*c* and the force point 114*a* form a set of sensing block.

A force point 114*b* is provided on the lower surface of the central portion of the sensing beam 113*d* in the longitudinal direction (an intersection point between the sensing beam 113*d* and the sensing beam 113*f*). The sensing beams 113*d*, 113*e*, and 113*f* and the force point 114*b* form a set of sensing blocks.

A force point 114*c* is provided on the lower surface of the central portion of the beam 113*g* in the longitudinal direction (an intersection of the beam 113*g* for detection and the beam 113*i* for detection). The sensing beams 113*g*, 113*h*, and 113*i* and the force point 114*c* form a set of sensing blocks.

The force point 114*d* is applied on the lower surface (an intersection point between the sensing beam 113*j* and the sensing beam 113*l*) of the central portion of the beam 113*j* in the longitudinal direction. The beams 113*j*, 113*k*, and 113*l* and the force point 114*d* form a set of sensing blocks.

The external force is applied to the force points 114*a* to 114*d*, which can be formed, for example, from the BOX layer of the SOI layer and the supporting portion layer. The bottom surface of each of the force points 114*a* to 114*d* is roughly flush with the bottom surface of the supporting portions 111*a* to 111*e*.

Thus, when force or displacement is taken in from four force points 114*a* to 114*d*, deformation of different beams is obtained for each type of force, so that a sensor with excellent 6-axis separation can be realized.

In the sensor chip 110, from the viewpoint of suppressing stress concentration, it is preferable that the portion forming the inner angle be R-shaped.

Figure 3:
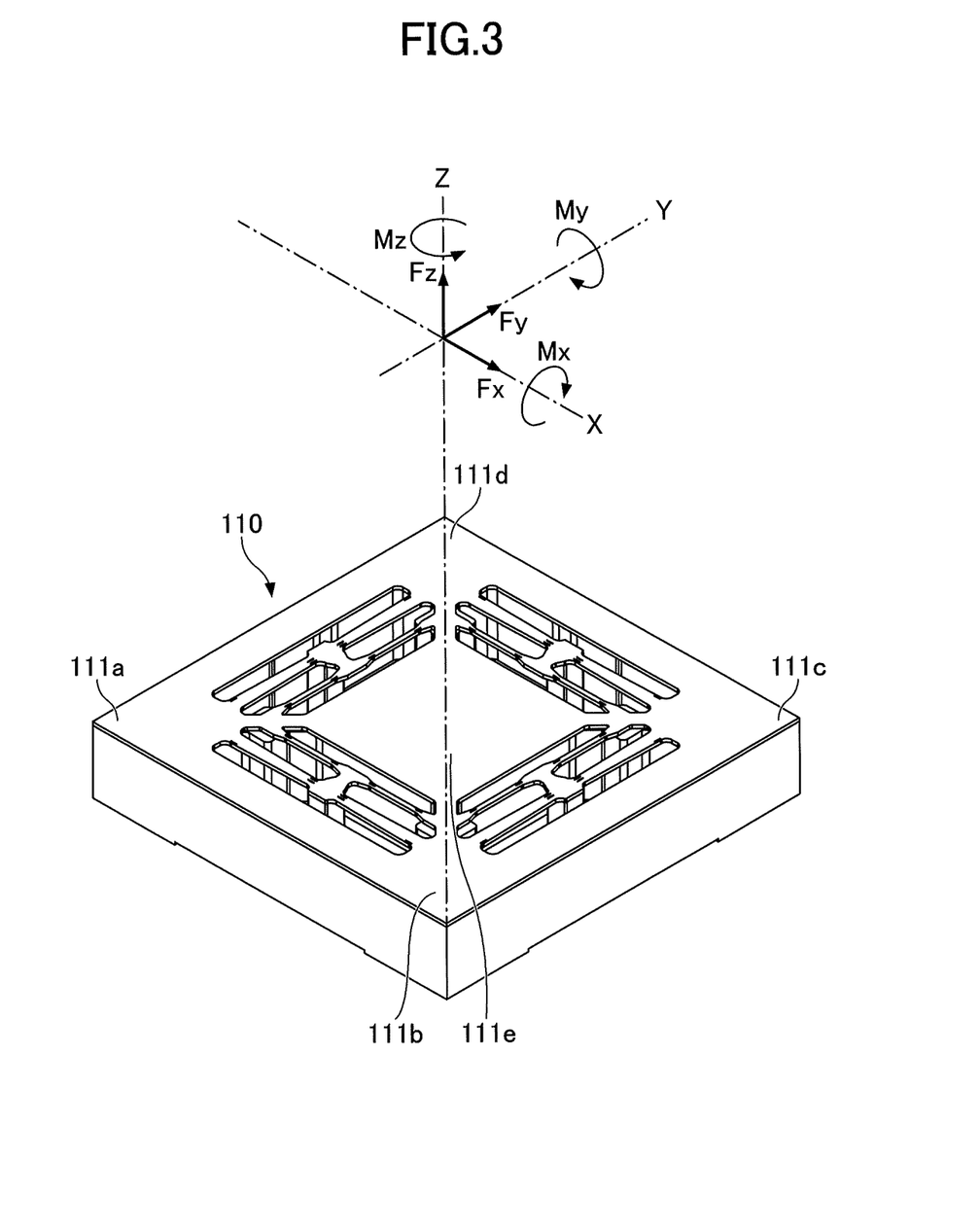
FIG. 3 is a diagram illustrating a code indicating force and a moment applied to each axis.

FIG. 3 is a diagram illustrating a code indicating the force and moment applied to each axis. As illustrated in FIG. 3, the force in the X-axis direction is Fx, the force in the Y-axis direction is Fy, and the force in the Z-axis direction is Fz. The moment to rotate around the X axis as the axis is Mx, the moment to rotate around the Y axis as the axis is My, and the moment to rotate around the Z axis as the axis is Mz.

Figure 4:
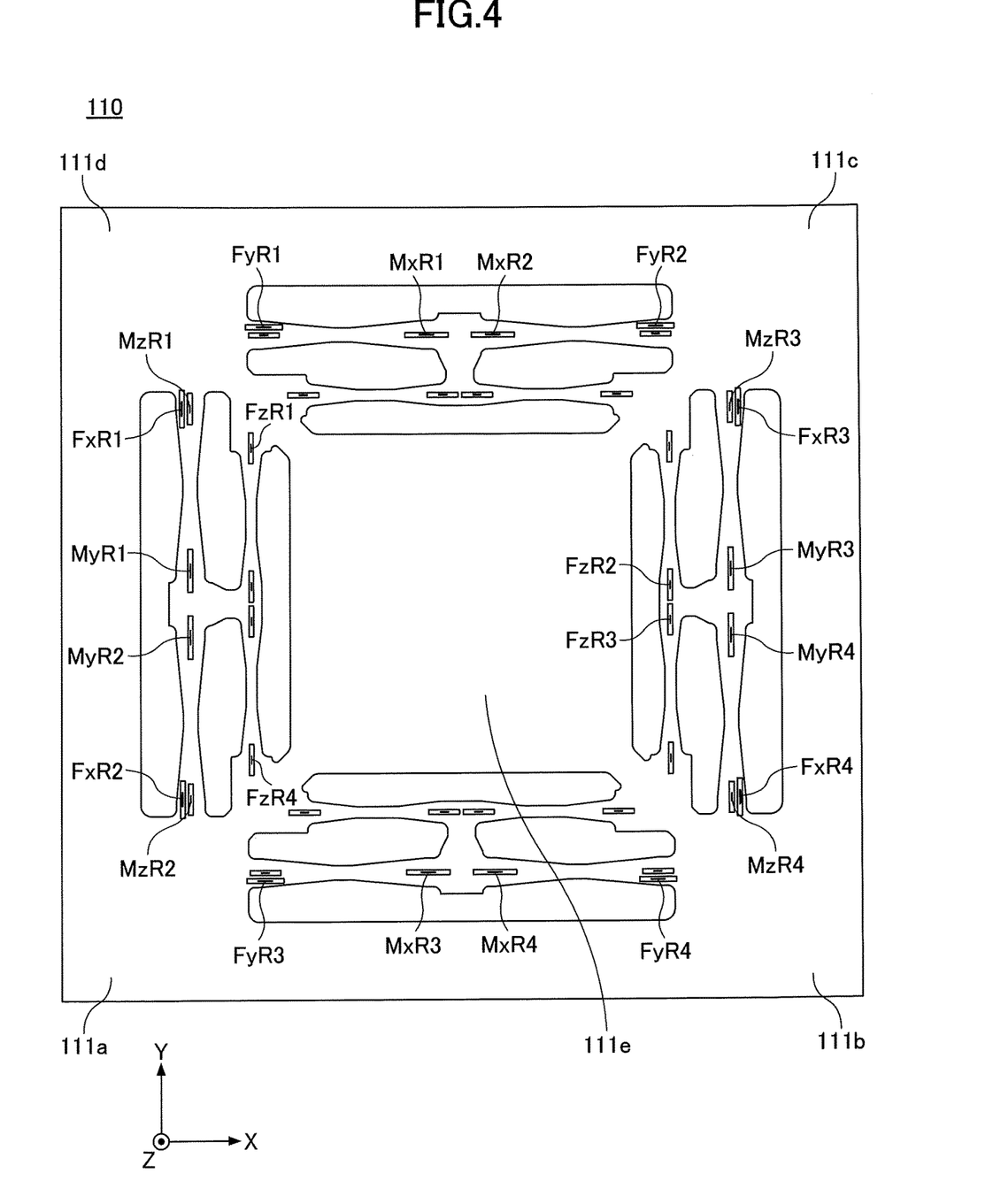
FIG. 4 illustrates an arrangement of piezoresistive elements of a sensor chip.

FIG. 4 illustrates the arrangement of piezoresistive elements of the sensor chip 110. A piezoresistive element is arranged at a predetermined position in each sensing block corresponding to four force points 114*a* to 114*d*.

Specifically, in the sensing block corresponding to the force point 114*a*, the piezoresistive elements MxR3 and MxR4 are disposed on a line that bisects the sensing beam 113*a* in the longitudinal direction and are symmetrical with respect to a line that bisects the sensing beam 113*c* in the longitudinal direction (the Y direction) in a region close to the sensing beam 113*c*. Further, the piezoresistive elements FyR3 and FyR4 are disposed at a position symmetrical to a line that is more than a line that divides the sensing beam 113*a* in the longitudinal direction by the reinforcing beam 112*a*, and a line that divides the sensing beam 113*c* in the longitudinal direction by the line that divides the sensing beam 113*c* in a region farther from the sensing beam 113*c*.

In the sensing block corresponding to the force point 114*b*, the piezoresistive elements MyR3 and MyR4 are arranged on a line that bisects the sensing beam 113*d* in the longitudinal direction and are symmetrical with respect to a line that divides the sensing beam 113*f* in the longitudinal direction (the X direction) in a region close to the sensing beam 113*f*. Further, the piezoresistive elements FxR3 and FxR4 are disposed at a position symmetrical to a line that is more than a line that divides the sensing beam 113*d* in the longitudinal direction by the reinforcing beam 112*b*, and a line that bisects the sensing beam 113*f* in the longitudinal direction in a distance from the sensing beam 113*f* of the sensing beam 113*d*.

The piezoresistive elements MzR3 and MzR4 are disposed on a line that bisects the sensing beam 113*d* in the longitudinal direction and are symmetrical with respect to a line that bisects the sensing beam 113*f* in the longitudinal direction in a distance from the sensing beam 113*f* of the sensing beam 113*d*. The piezoresistive elements FzR2 and FzR3 are disposed at a position symmetrical to a line that is more than a line that bisects the sensing beam 113*e* longitudinally and symmetrical to a line that bisects the sensing beam 113*f* longitudinally in a region close to the sensing beam 113*f* of the sensing beam 113*e*.

In the sensing block corresponding to the force point 114*c*, the piezoresistive elements MxR1 and MxR2 are disposed on a line that bisects the sensing beam 113*g* in the longitudinal direction and are symmetrical with respect to a line that bisects the sensing beam 113*i* in the longitudinal direction (the Y direction) in a region close to the sensing beam 113*i*. The piezoresistive elements FyR1 and FyR2 are disposed at a position symmetrical with respect to a line for bisecting the sensing beam 113*g* in a longitudinal direction, which is a side of the reinforcing beam 112*c* more than a line for bisecting the sensing beam 113*g* in a longitudinal direction, and a position symmetrical with respect to a line for bisecting the sensing beam 113*i* in a longitudinal direction in a distance from the sensing beam 113*i*.

In the sensing block corresponding to the force point 114*d*, the piezoresistive elements MyR1 and MyR2 are arranged on a line that bisects the sensing beam 113*j* in the longitudinal direction and are symmetrical with respect to a line that divides the sensing beam 113*l* in the longitudinal direction (the X direction) in a region close to the sensing beam 113*l*. The piezoresistive elements FxR1 and FxR2 are disposed at a position symmetrical with respect to a line that is more than a line that divides the sensing beam 113*j* in the longitudinal direction by the reinforcing beam 112*d*, and which is further from the sensing beam 113*l* in the longitudinal direction by the sensing beam 113*l*.

The piezoresistive elements MzR1 and MzR2 are disposed on a line that bisects the beam 113*j* in the longitudinal direction and are symmetrical with respect to a line that bisects the beam 113*l* in the longitudinal direction in a region far from the beam 113*l* for detection of the beam 113*j*. The piezoresistive elements FzR1 and FzR4 are disposed at a position symmetrical with respect to a line that is more than a line that bisects the sensing beam 113*k* longitudinally, and a line that bisects the sensing beam 113*l* longitudinally in a distance from the sensing beam 113*l*. This allows a predetermined axial displacement to be sensed up to six axes based on a change in the output of a plurality of piezoresistive elements disposed in a predetermined beam according to the direction (axial direction) of the force applied (transmitted) to the force points 114a to 114d.

The sensor chip 110 is constructed so that the beams 113c, 113f, 113i, and 113l for detection are as short as possible so that the beams 113b, 113e, 113h, and 113k are close to the beams 113a, 113d, 113g, and 113j for detection, and the lengths of the beams 113b, 113e, 113h, and 113k are secured as long as possible. This structure makes the beams 113b, 113e, 113h, and 113k for sensing easy to flex in a bow-like fashion, thereby alleviating stress concentration and improving the load resistance.

Also, in the sensor chip 110, piezoresistive elements are not disposed in the sensing beams 113c, 113f, 113i, and 113l, which are shortened to reduce deformation to stress. Instead, piezoresistive elements are disposed in the vicinity of locations where the stresses of the detector beams 113c, 113f, 113i, and 113l are greatest, thinner than those of the detector beams 113a, 113d, 113g, and 113j, as well as the detector beams 113b, 113e, 113h, and 113k, are narrower, longer, more flexible, and more bow-like. As a result, the sensor chip 110 can efficiently capture stress and improve sensitivity (the change in resistance of the piezoresistive element to the same stress).

In the sensor chip 110, a dummy piezoresistive element is disposed in addition to the piezoresistive element used for detecting distortion. The dummy piezoresistive elements are arranged such that all piezoresistive elements, including the piezoresistive elements used for strain detection, are point symmetrical with respect to the center of the supporting portion 111e.

Here, piezoresistive elements FxR1 to FxR4 detect force Fx, piezoresistive elements FyR1 to FyR4 detect force Fy, and piezoresistive elements FzR1 to FzR4 detect force Fz. The piezoresistive elements MxR1 to MxR4 detect the moment Mx, the piezoresistive elements MyR1 to MyR4 detect the moment My, and the piezoresistive elements MzR1 to MzR4 detect the moment Mz.

In this manner, the sensor chip 110 arranges a plurality of piezoresistive elements separately in each sensing block. This allows a predetermined axial displacement to be sensed up to six axes based on a change in the output of a plurality of piezoresistive elements disposed on a predetermined beam in response to a force applied (transmitted) to or a direction of displacement (axial direction) at force points 114a to 114d.

Specifically, in the sensor chip 110, a displacement (Mx, My, Fz) in the Z-axis direction can be sensed based on a deformation of a predetermined sensing beam. That is, the moments (Mx, My) in the X- and Y-axes directions can be sensed based on the deformations of the first sensing beam 113a, 113d, 113g, and 113j. The force (Fz) in the Z-axis direction can be sensed based on deformation of the sensing beams 113e and 113k, which are the second sensing beams.

In the sensor chip 110, the displacement (Fx, Fy, Mz) in the X-axis direction and the Y-axis direction can be sensed based on the deformation of the predetermined sensing beam. That is, the force (Fx, Fy) in the X-axis direction and the Y-axis direction can be sensed based on the deformation of the sensing beams 113a, 113d, 113g, and 113j, which are the first sensing beam. The moment (Mz) in the Z-axis direction can be sensed based on the deformation of the sensing beams 113d and 113j, which are the first sensing beam.

In the sensor chip 110, the output of each axis is obtained from a bridge circuit formed one by one for each axis.

However, it is also possible to reduce the number of piezoresistive elements and provide a sensor chip for detecting predetermined axial displacements of 5 or less axes.

Figure 5:
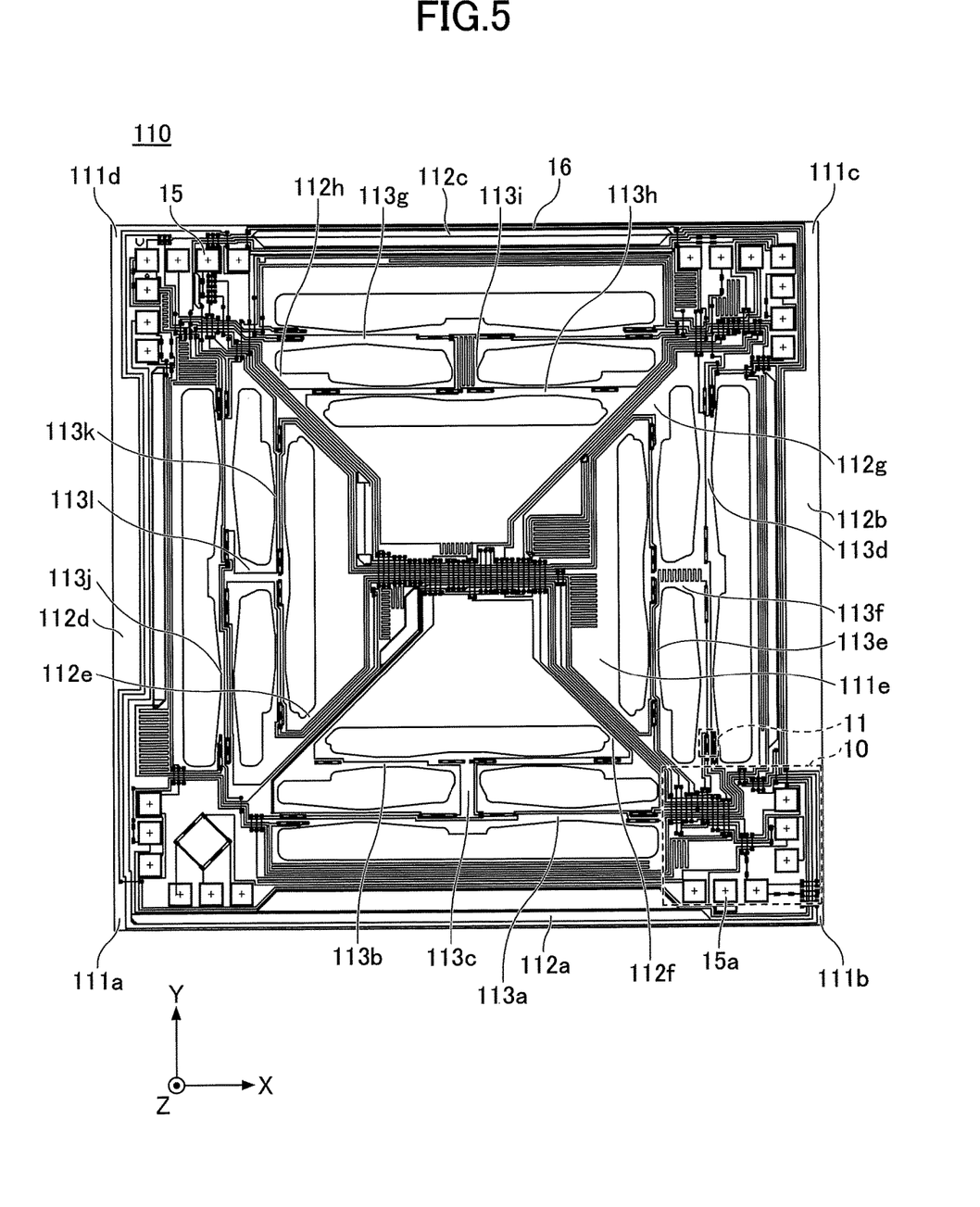
FIG. 5 illustrates an electrode arrangement and wiring in a sensor chip.

FIG. 5 is a plan view illustrating electrode arrangement and wiring in the sensor chip 110 viewed from the upper side of the Z-axis direction. As illustrated in FIG. 5, the sensor chip 110 includes a plurality of electrode pads 15 for retrieving an electrical signal. Each electrode pad 15 is disposed on the top surface of the supporting portion 111a-111d of the sensor chip 110 with the least strain when force is applied to the force points 114a to 114d. The wiring 16 from each piezoresistive element to the electrode pad 15 can be appropriately routed on each reinforcing beam and on each sensing beam.

As described above, each reinforcing beam can be used as a detour circuit for drawing out the wiring if necessary. Therefore, by arranging the reinforcing beam separately from the sensing beam, the degree of freedom of the wiring design can be improved. This allows each piezoresistive element to be placed in a more ideal position.

The sensor chip 110 also includes an electrode pad 15a for pulling up the substrate potential with a power supply voltage.

Figure 6:
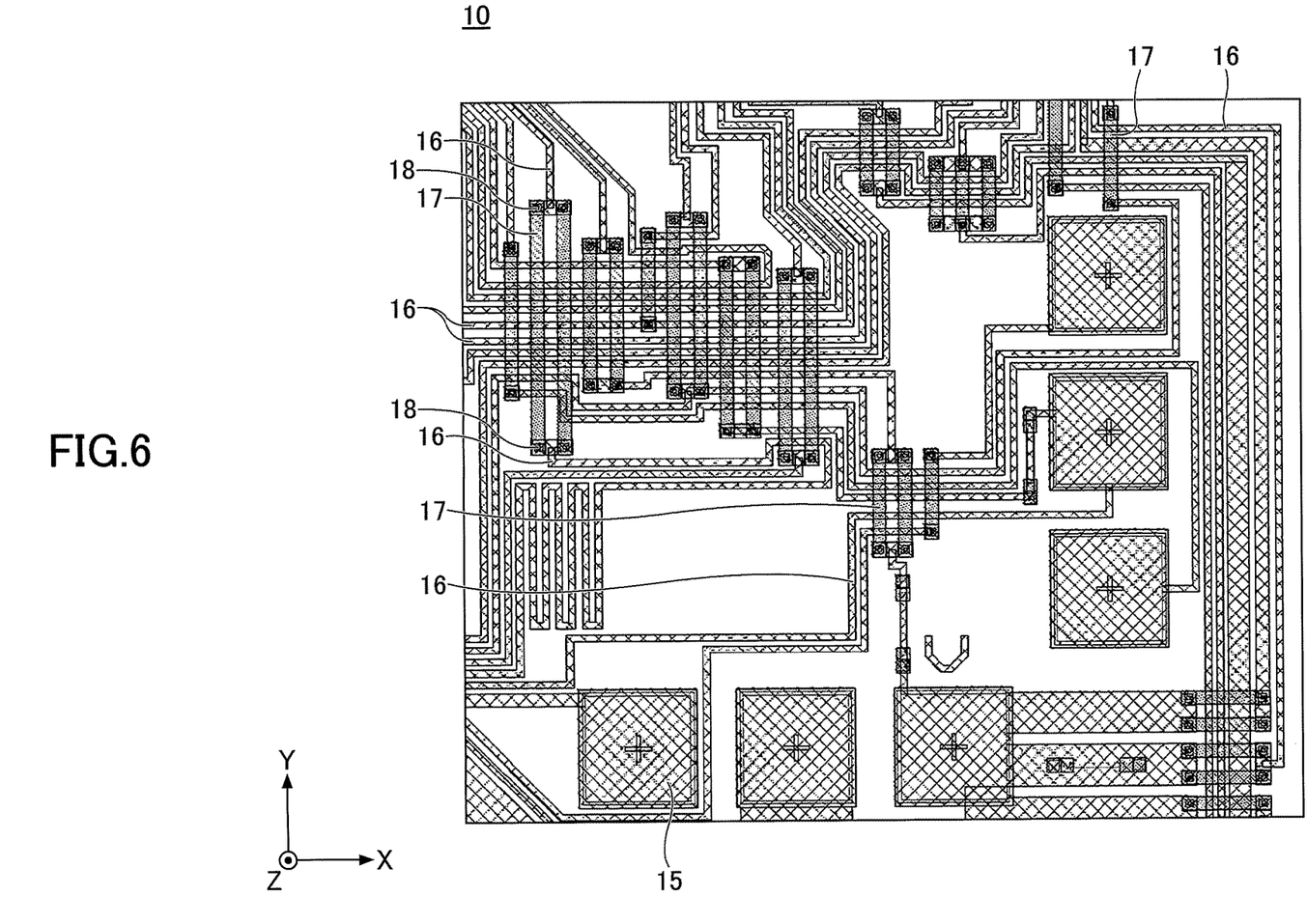
FIG. 6 illustrates an electrode pad and wiring layout in the region of the supporting portion in FIG. 5.

FIG. 6 illustrates the layout of the electrode pads and wiring in the region 10 of the supporting portion lib of FIG. 5. The wiring 16 is a metal wiring made of aluminum or the like formed on a substrate. Each wiring 16 consists of the same layer and is routed to each portion, so that the diffusion wiring 17 is formed at the intersection of the wiring 16. The diffusion wiring 17 is formed by a diffused layer within the substrate and is connected to the wiring 16 via a contact plug 18.

Figure 7:
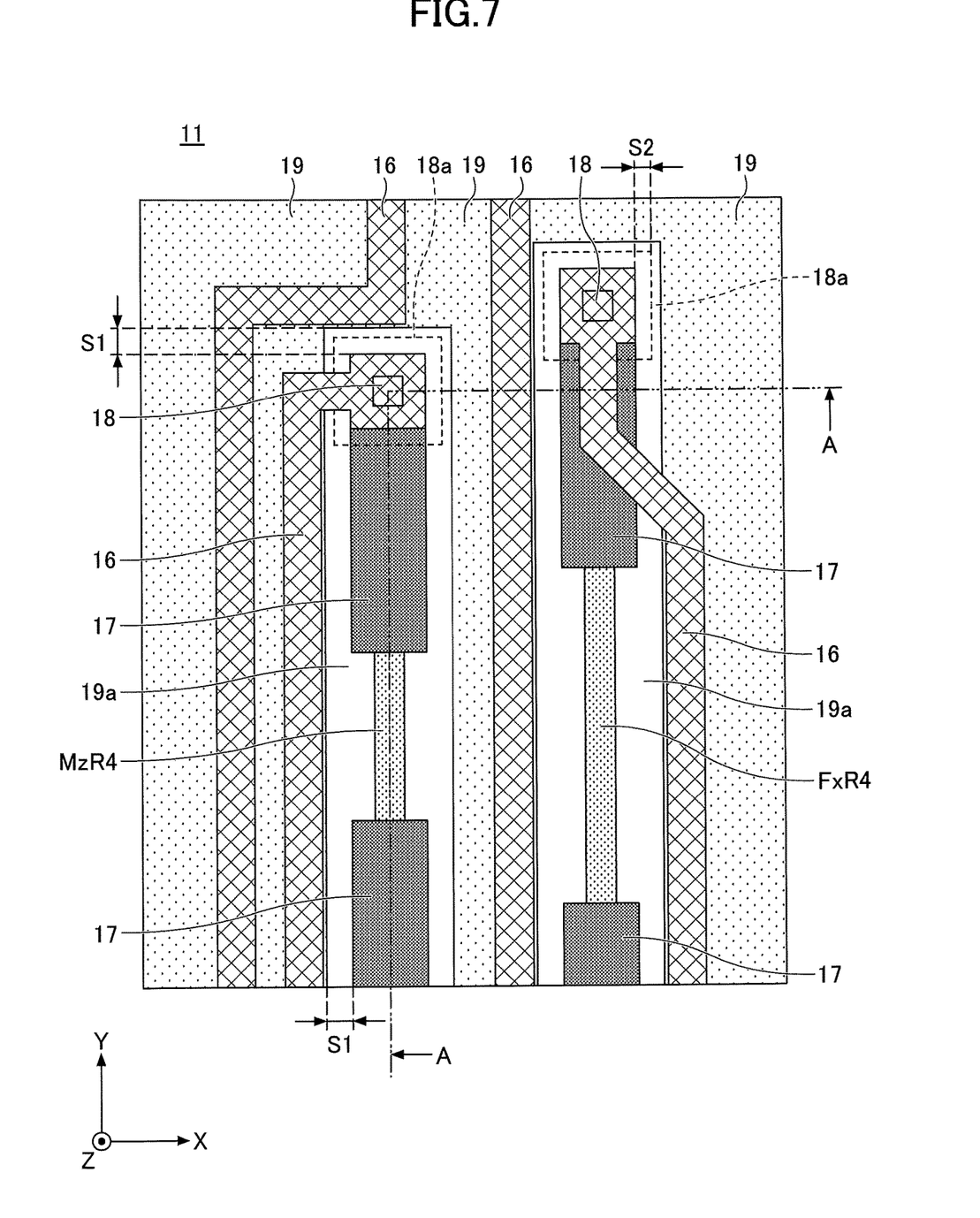
FIG. 7 illustrates a layout of wiring in a region containing piezoresistive elements in FIG. 5.

FIG. 7 is a diagram illustrating a layout of the wiring in a region 11 including piezoresistive elements MzR4, FxR4 in FIG. 5. Piezoresistive elements MzR4 and FxR4 are each formed between a pair of diffusion wirings 17. The piezoresistive elements MzR4 and FxR4 have the same polarity as the diffusion wiring 17 and have a diffusion region with an impurity concentration lower than that of the diffusion wiring 17. The diffusion wiring 17 is connected to the wiring 16 via a contact plug 18.

A first barrier layer 19 is formed around the diffusion wiring 17 and piezoresistive elements MzR4 and FxR4, which is a diffusion region having a polarity opposite to the diffusion wiring 17 and piezoresistive elements MzR4 and FxR4. That is, the first barrier layer 19 is formed in regions other than the diffusion wiring 17 and the forming regions 19a of the piezoresistive element.

The first barrier layer 19 is formed between at least adjacent diffusion wiring 17 (except where piezoresistive elements are connected).

Figure 8:
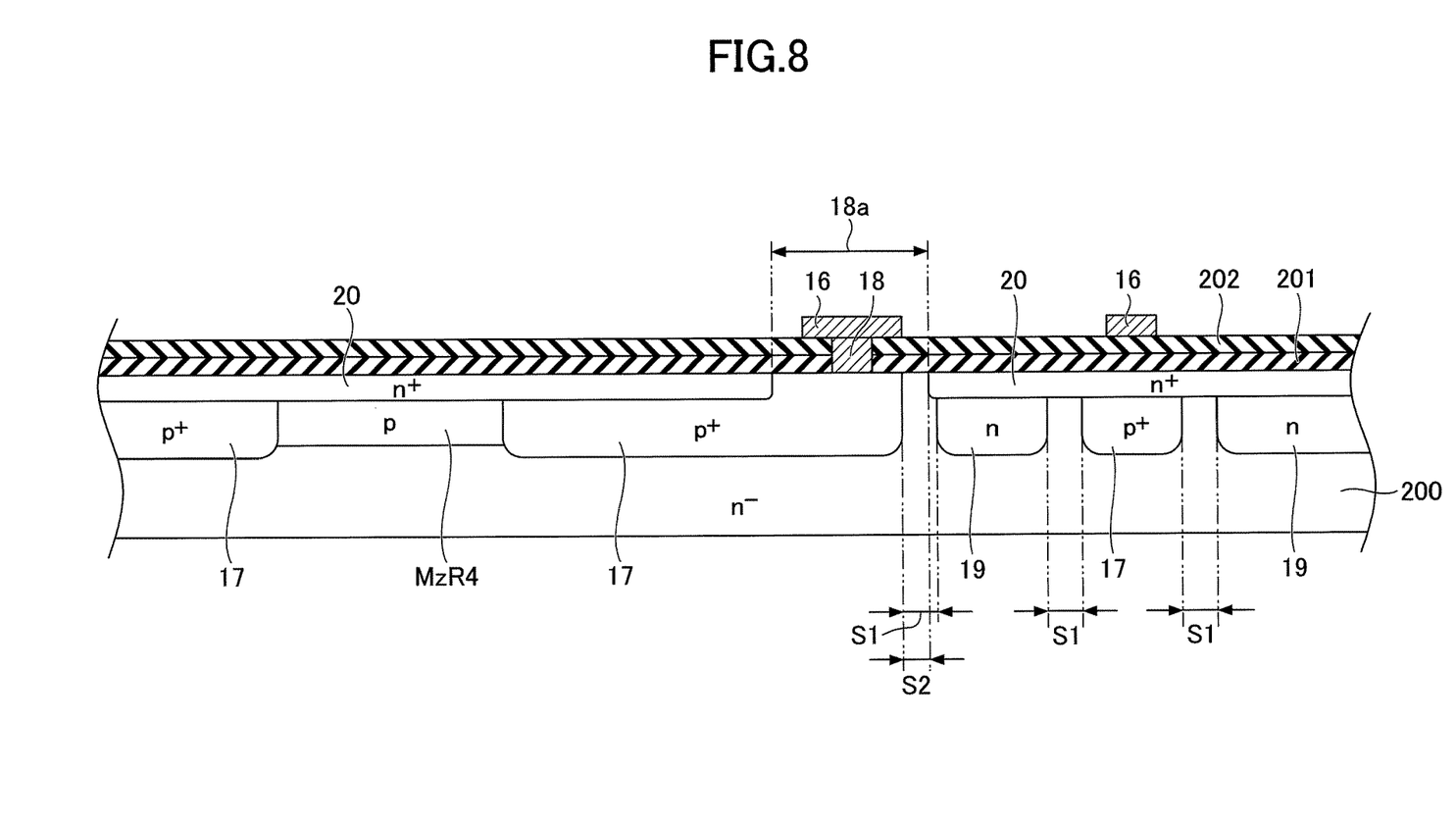
FIG. 8 is a view illustrating a cross-section along the A-A line in FIG. 7.

FIG. 8 is a view illustrating a cross-section along the A-A line in FIG. 7. As illustrated in FIG. 8, the sensor chip 110 is formed using a semiconductor substrate 200. When the sensor chip 110 is formed using an SOI substrate, the semiconductor substrate 200 is, for example, the active layer of the SOI substrate. The semiconductor substrate 200 is, for example, an n-type semiconductor substrate in which an n-type impurity is injected into a single crystal silicon. The impurity concentration of semiconductor substrate 200 is, for example, $1.0 \times 10^{-15}$ [m$^{-3}$].

The diffusion wiring 17 is formed by injecting a p-type impurity into a predetermined region of the surface layer of the semiconductor substrate 200.

The first barrier layer 19 is formed by injecting an n-type impurity into a predetermined region of the surface layer of the semiconductor substrate 200. The impurity concentration of the first barrier layer 19 is higher than the impurity concentration of the semiconductor substrate 200, for example $4.0 \times 10^{-15}$ [m$^{-3}$]. The first barrier layer 19 is formed so as to be spaced S1 apart from the end of the diffusion wiring 17.

Spacing S1 is, for example, 3.5 μm.

The piezoresistive element MzR4 is formed by injecting p-type impurities into a predefined region of the surface layer of the semiconductor substrate 200. The impurity concentration of the piezoresistive element MzR4 is lower than the impurity concentration of the diffusion wiring 17. The same applies to other piezoresistive elements and is formed by the same manufacturing process as the piezoresistive element MzR4.

In addition, a second barrier layer 20 is formed on the surface layer of the semiconductor substrate 200. The second barrier layer 20 is formed by injecting an n-type impurity into a predetermined region of the surface layer of the semiconductor substrate 200. The second barrier layer 20 is formed on the surface layer that is shallower than the diffusion wiring 17, the first barrier layer 19, and the piezoresistive element. The impurity concentration of the second barrier layer 20 is higher than the impurity concentration of the first barrier layer 19, e.g., $1.0 \times 10^{-13}$ [m$^{-3}$].

The second barrier layer 20 is formed in a region other than the region 18a (see FIG. 7) that forms the contact plug 18. The second barrier layer 20 is also formed so as to be spaced S2 apart from the end of the diffusion wiring 17. The gap S2 is about 2 to 3 μm, for example.

A surface insulating film 201 made of silicon oxide (SiO$_2$) is formed on the semiconductor substrate 200. An interlayer insulating film 202 made of silicon nitride (Si$_3$N$_4$) is formed on the surface insulating film 201.

The contact plug 18 is formed by filling a through-hole formed by etching an interlayer insulating film 202 and a surface insulating film 201 with a metallic material.

The wiring 16 is formed by patterning a metal film made of aluminum or the like formed on the interlayer insulating film 202. The electrode pad 15 is formed of the same metal film as the wiring 16.

A diffusion wiring 17, a first barrier layer 19, a piezoresistive element, and a second barrier layer 20 are formed on the semiconductor substrate 200 in this order. The first barrier layer 19 is formed, for example, by ion implantation of an n-type impurity at an accelerating voltage of 50 KeV. The depth of the first barrier layer 19 and the second barrier layer 20 are approximately constant, respectively.

Figure 9:
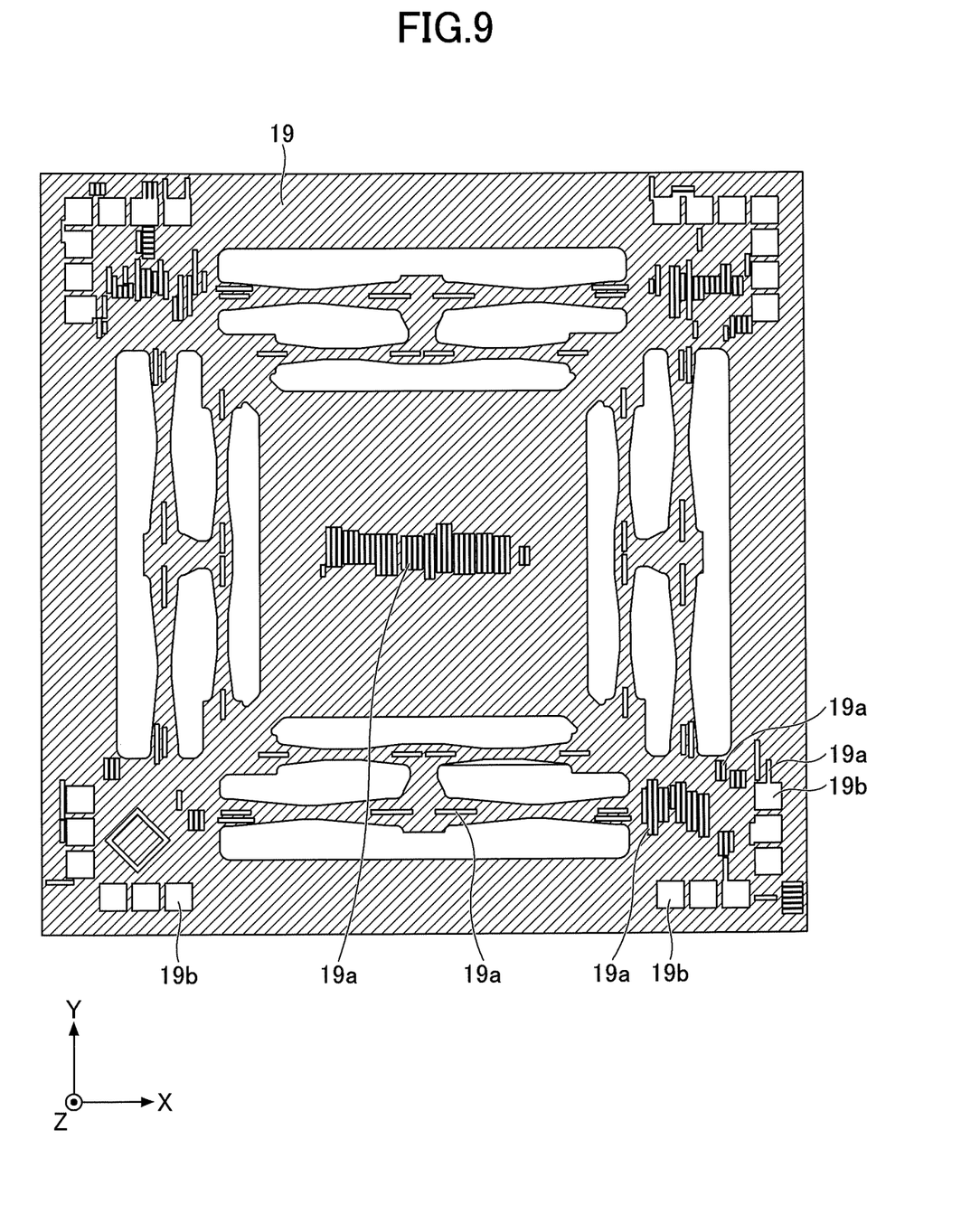
FIG. 9 is a plan view illustrating the forming region of the first barrier layer.

FIG. 9 is a plan view illustrating the formed region of the first barrier layer 19. The first barrier layer 19 is basically formed in the region other than the diffusion wiring 17 and the region 19a forming the piezoresistive element, but in this embodiment, the region 19b forming the electrode pad 15 is also excluded.

Figure 10:
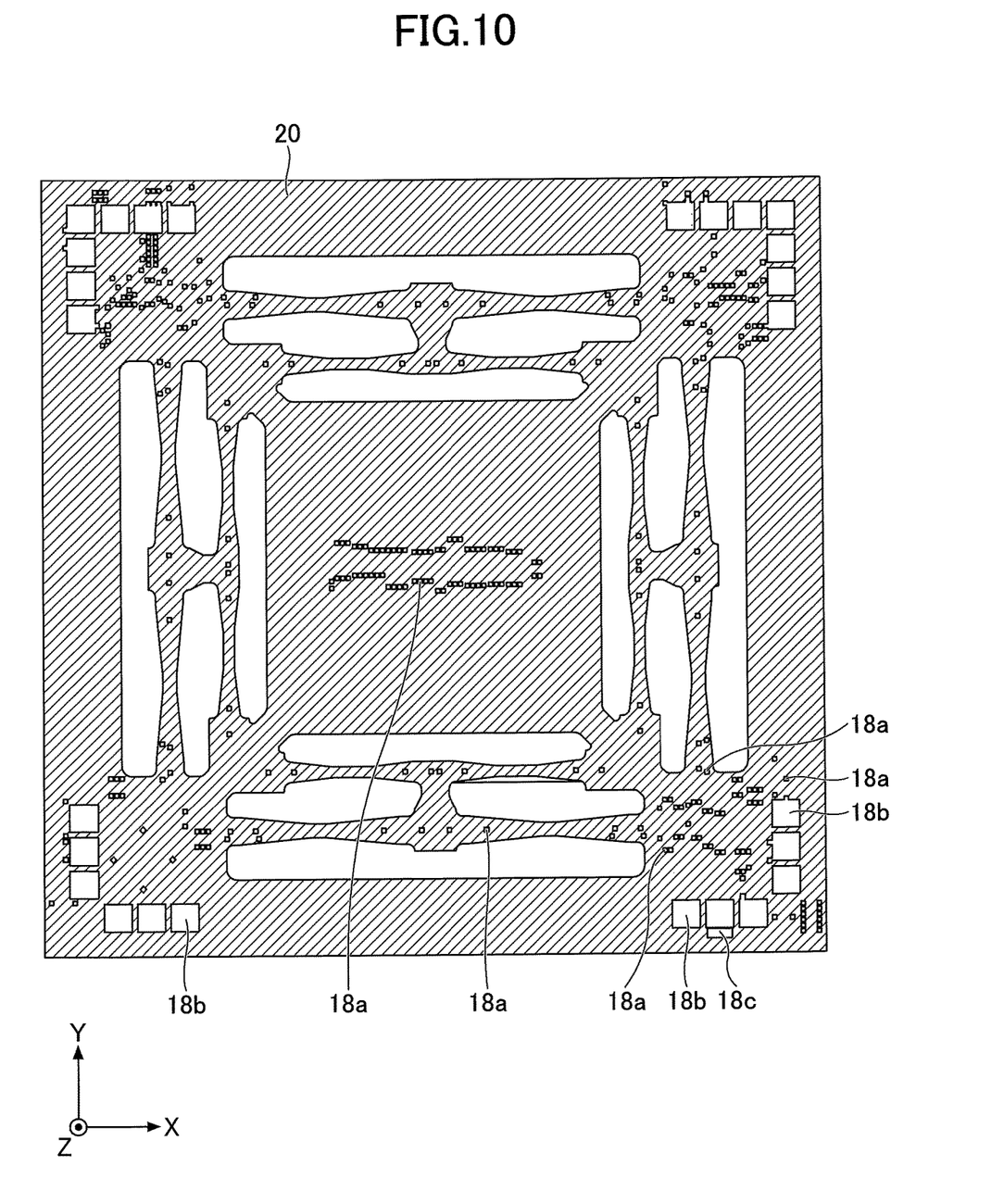
FIG. 10 is a plan view illustrating the forming region of the second barrier layer.

FIG. 10 is a plan view illustrating the formed region of the second barrier layer 20. The second barrier layer 20 is essentially formed in the region other than the region 18a forming the contact plug 18, but in this embodiment also excludes the region 18b forming the electrode pad 15. The second barrier layer 20 also removes the contact portion 18c for contacting the electrode pads 15a for pull-up described above with the semiconductor substrate 200.

Figure 11:
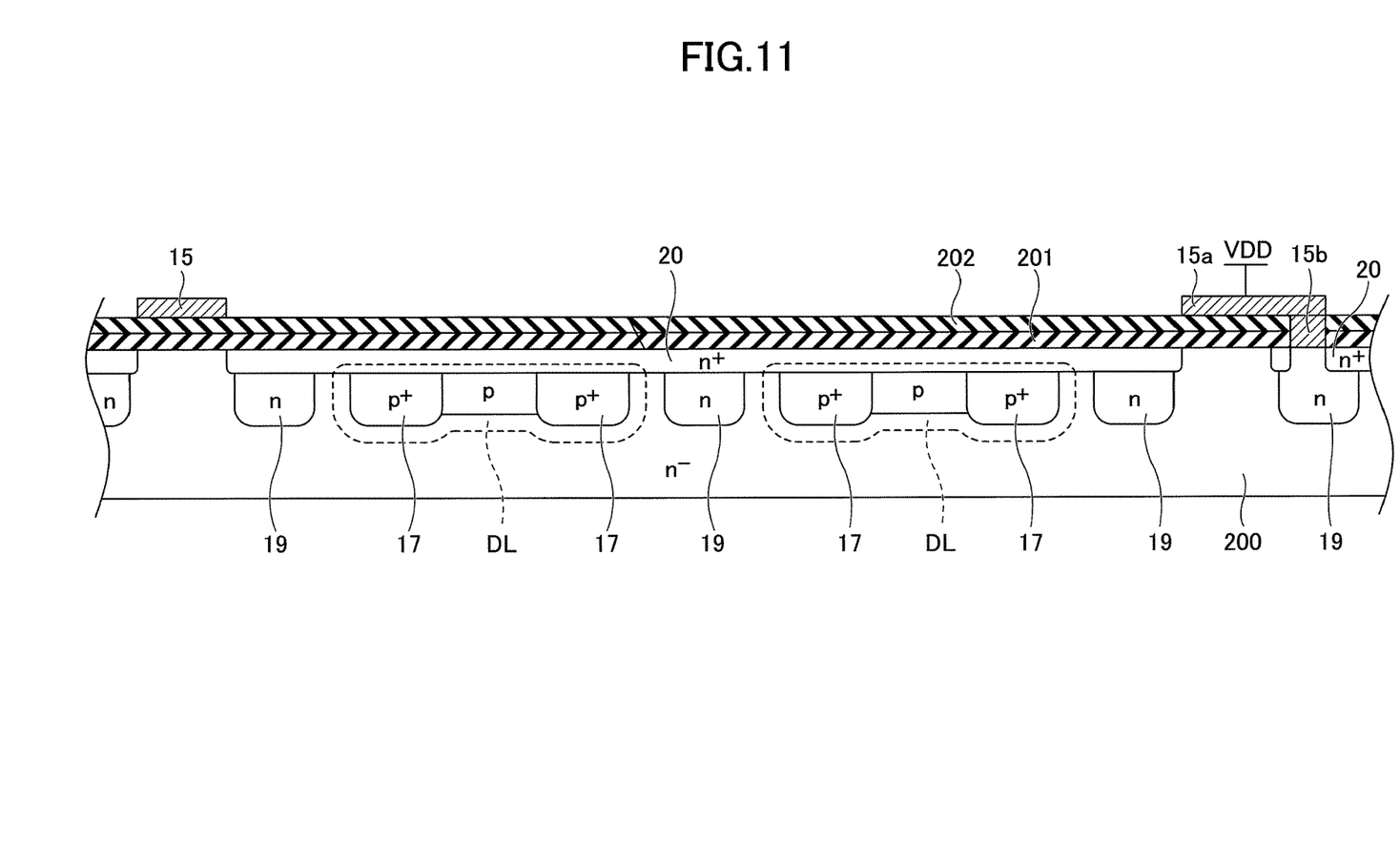
FIG. 11 is a schematic diagram illustrating a cross-section of a main portion of the sensor chip.

FIG. 11 is a schematic diagram illustrating a cross-section of the main portion of the sensor chip 110. As illustrated in FIG. 11, the first barrier layer 19 and the second barrier layer 20 are not provided below the electrode pad 15. This is to prevent stresses during wire bonding from affecting the entire first barrier layer 19 and second barrier layer 20 because of the bonding wire connected to electrode pads 15. In this embodiment, the first barrier layer 19 and the second barrier layer 20 are not provided below the electrode pads 15 in consideration of the influence of stress during wire bonding. However, if the influence of stress during wire bonding on the first barrier layer 19 and the second barrier layer 20 can be negligible, either one or both of the first barrier layer 19 and the second barrier layer 20 may be provided below the electrode pads 15.

A second barrier layer 20 is not provided below the contact plug 15b connected to the pull-up electrode pad 15a, but the first barrier layer 19 is provided. Thus, the pull-up electrode pads 15a are connected to the first barrier layer 19 via contact plugs 15b through the interlayer insulating film 202 and the surface insulation film 201 to pull-up the potential of the first barrier layer 19 with a power supply voltage VDD.

(Effect)

A depletion layer DL is generated around the diffusion wiring 17, but a depletion layer DL is thinned due to a potential difference between the wiring 16 and the semiconductor substrate 200, resulting in a parasitic MOS structure. Therefore, a leakage path may be generated in the adjacent diffusion wiring 17. In the sensor chip 110 in accordance with this embodiment, because the first barrier layer 19 having the polarity opposite to the diffusion wiring 17 is formed in the adjacent diffusion wiring 17, the depletion layer DL is expanded due to the reverse bias, and the generation of leakage current is suppressed. Similarly, in the sensor chip 110 in accordance with the present embodiment, the first barrier layer 19 is formed between adjacent piezoresistive elements which is opposite to the piezoresistive element in polarity, so that the generation of leakage current between the piezoresistive elements is suppressed.

Further, when a charged foreign object is adhered to the surface of the sensor chip 110, a leakage path may occur between the wiring 16 and the diffusion wiring 17 or between the wiring 16 and the piezoresistive element. In the sensor chip 110 in accordance with the present embodiment, since the second barrier layer 20 is formed on the surface layer of the diffusion wiring 17 and the piezoresistive element, which is polar to the diffusion wiring 17 and the piezoresistive element, a depletion layer DL is also formed between the diffusion wiring 17 and the piezoresistive element and the second barrier layer 20, so that the occurrence of leakage current between the wiring 16 and the diffusion wiring 17 and between the wiring 16 and the piezoresistive element is suppressed.

By suppressing the generation of leakage current, the offset and noise characteristics at the output of the sensor chip 110 are improved. The offset characteristic is the characteristic of the offset voltage of the output voltage from the bridge circuit. The leakage current causes fluctuations in the offset voltage in response to the leakage current, resulting in errors in the detected values of force and moment.

By suppressing the generation of leakage current, the detection accuracy can be improved. In particular, in the sensor chip 110 that enables the 6-axis detection, the output for the force and the moment in the Z-axis direction is small, and the chip is susceptible to the influence of the leakage current, so that the improvement effect is large by suppressing the generation of the leakage current.

In the above embodiment, the semiconductor substrate 200, the first barrier layer 19, and the second barrier layer 20 are n-type, and the diffusion wiring 17 and the piezoresistive element are p-type. However, the first barrier layer 19 and the second barrier layer 20 may be p-type, and the diffusion wiring 17 and the piezoresistive element may be n-type. The relationship between the impurity concentrations in each layer is the same as above.

Although the preferred embodiments have been described in detail above, various modifications and substitutions can be made to the embodiments described above without departing from the scope of the appended claims.

Effects of the Invention

According to the disclosed technique, leakage current can be suppressed.

DESCRIPTION OF SYMBOLS

15: Electrode pads;
15*a*: Electrode pad;
15*b*: Contact plugs;
16: Wiring;
17: Diffusion wiring;
18: Contact plug;
18*c*: Contact portion;
19: First barrier layer;
20: Second barrier layer;
110: Sensor chip;
200: Semiconductor substrate;
201: Surface insulation film; and
202: Interlayer insulation film.

What is claimed is:

1. A sensor device comprising:
   a first piezoresistive element and a second piezoresistive element, each of which is formed in a semiconductor substrate and has a polarity opposite to a polarity of the semiconductor substrate, the first piezoresistive element and the second piezoresistive element being arranged to detect either respective axial forces in mutually different axial directions or respective moments of force around the mutually different axial directions;
   a first diffusion wiring and a second diffusion wiring, each of which is formed in the semiconductor substrate and has the polarity opposite to the polarity of the semiconductor substrate, the first diffusion wiring being connected with the first piezoresistive element, the second diffusion wiring being connected with the second piezoresistive element;
   a first barrier layer formed between the first and second diffusion wirings in the semiconductor substrate and has a same polarity as the polarity of the semiconductor substrate; and
   a second barrier layer that is formed on surface layers of the first and second piezoresistive elements and the first and second diffusion wirings, the first and second barrier layers having a same polarity.

2. The sensor device according to claim 1, the sensor device further comprises:
   a wiring;
   a contact plug; and
   an insulating film,
   wherein the wiring is formed on the semiconductor substrate via the insulating film and is connected to each of the first and second diffusion wirings via the contact plug penetrating through the insulating film.

3. The sensor device according to claim 2, the sensor device further comprising:
   a pull-up electrode pad formed on the insulating film,
   wherein the electrode pad is connected to the first barrier layer via the contact plug through the insulating film.

4. The sensor device according to claim 3,
   wherein the polarity of the semiconductor substrate is an n-type.

5. The sensor device according to claim 1,
   wherein the first barrier layer has a higher impurity concentration than an impurity concentration of the semiconductor substrate, and
   the second barrier layer has a higher impurity concentration than the impurity concentration of the first barrier layer.

6. The sensor device according to claim 5,
   wherein the first and second diffusion wirings have a higher impurity concentration than an impurity concentration of the first and second piezoresistive elements.

7. The sensor device according to claim 1,
   wherein the first barrier layer is formed between the first piezoresistive element and the second piezoresistive element adjacent to the first piezoresistive element.

8. The sensor device according to claim 1,
   wherein the mutually different axial directions include multiple mutually different axial directions.

* * * * *